United States Patent
Yano

[11] Patent Number: 5,630,220
[45] Date of Patent: May 13, 1997

[54] AUTOMATIC GAIN CONTROL CIRCUIT FOR RADIO COMMUNICATION APPARATUS

[75] Inventor: Ryuji Yano, Tokyo, Japan

[73] Assignee: Kabushiki Kaisha Toshiba, Kawasaki, Japan

[21] Appl. No.: 64,939

[22] Filed: May 24, 1993

[30] Foreign Application Priority Data

May 22, 1992 [JP] Japan .................................. 4-130977

[51] Int. Cl.⁶ .................................................. H04B 1/10
[52] U.S. Cl. ...................... 455/234.1; 455/266; 455/339; 375/345
[58] Field of Search ................... 455/234.1, 240.1, 455/250.1, 251.1, 245.1, 249.1, 324, 307, 237.1, 315, 295, 296, 303, 311, 339, 232.1, 254, 266, 235.1; 375/345

[56] References Cited

U.S. PATENT DOCUMENTS

| | | | |
|---|---|---|---|
| 1,342,885 | 6/1920 | Armstrong | 455/315 |
| 2,974,224 | 3/1961 | Ule | 455/237.1 |
| 4,270,222 | 5/1981 | Menant | 455/249.1 |
| 4,656,630 | 4/1987 | Miyo | 455/249.1 |
| 4,792,992 | 12/1988 | Rinderle | 455/249.1 |
| 5,001,776 | 3/1991 | Clarke | 455/234.1 |
| 5,036,527 | 7/1991 | Halim et al. | 455/245.1 |
| 5,134,722 | 7/1992 | Emslie et al. | 455/249.1 |
| 5,175,882 | 12/1992 | Higashijima | 455/251.1 |
| 5,230,098 | 7/1993 | Seki | 455/234.1 |
| 5,251,218 | 10/1993 | Stone et al. | 455/324 |
| 5,339,454 | 8/1994 | Kuo et al. | 455/307 |
| 5,339,455 | 8/1994 | Vogt et al. | 455/307 |
| 5,361,395 | 11/1994 | Yamamoto | 455/234.1 |
| 5,390,345 | 2/1995 | Wada et al. | 455/234.1 |
| 5,408,698 | 4/1995 | Serizawa et al. | 455/240.1 |

FOREIGN PATENT DOCUMENTS

| | | | |
|---|---|---|---|
| 0069507 | 6/1978 | Japan | 455/234.1 |
| 9006644 | 6/1990 | WIPO | 455/234.1 |
| 9117606 | 11/1991 | WIPO | 455/234.1 |

Primary Examiner—Reinhard J. Eisenzopf
Assistant Examiner—Nguyen Vo
Attorney, Agent, or Firm—Finnegan, Henderson, Farabow, Garrett & Dunner, L.L.P.

[57] ABSTRACT

A radio communication apparatus having a reception system having an automatic gain control circuit, which includes a first band-pass filter with a wide band inserted into a signal supplying passage to a digital demodulator located in the subsequent stage of a variable gain type intermediate frequency amplifier. The automatic gain control circuit further includes a second band-pass filter with a narrow-band set narrower than that of the first band-pass filter, inserted in a circuit that forms an automatic gain control (AGC) loop. Received analog signals are modulated and subjected to digital demodulation by the digital demodulator after passing through the first band-pass filter. Received intermediate-frequency signals which have passed through the second band-pass filter are supplied to a detector provided in the AGC loop. A gain control signal corresponding to the difference between the signal level value detected by the detector and a predetermined reference value is generated from an error amplifier, and is looped back to the intermediate frequency amplifier to control the gain thereof.

10 Claims, 4 Drawing Sheets

AUTOMATIC GAIN CONTROL CIRCUIT FOR RADIO COMMUNICATION APPARATUS

BACKGROUND OF THE INVENTION

1. Field of the Invention

The present invention relates to a radio communication apparatus used for signal transmission and reception in a mobile radio communication system which is used in a portable mobile radio telephone system, a cordless telephone system and so forth. More particularly, this invention relates to a gain control circuit provided in a radio communication apparatus which employs a digital communication system.

2. Description of the Related Art

Recently, a "dual-mode type" communication system, which employs a digital communication system that provides better tap-free environment and can ensure more effective utilization of the radio frequency than an analog communication system, becomes gradually popular as an example of the application of a mobile radio communication system. The "dual-mode" system is the communication system which selectively uses analog and digital modes to execute radio communication. In analog mode, carrier signals are, for example, frequency-modulated with analog speech signals in a transmitter. In digital mode speech signals are encoded and carrier signals are modulated with the coded speech signals by a digital modulation system, such as π/4 shifted DQPSK (Differentially encoded Quadrature Phase Shift Keying), before transmission.

In general, a radio communication apparatus which is used in a communication system of the above digital communication system, transmits information on a waveform that has a predetermined phase and a predetermined amplitude. Once a received signal becomes saturated in the receiver system, therefore, this radio communication apparatus cannot perform accurate demodulation of the modulated waveform thereafter. Thus, this type of radio communication apparatus is generally provided with an automatic gain control (AGC) circuit in the intermediate frequency stage in the receiver system to prevent the saturation of the received signal.

Figure 6:
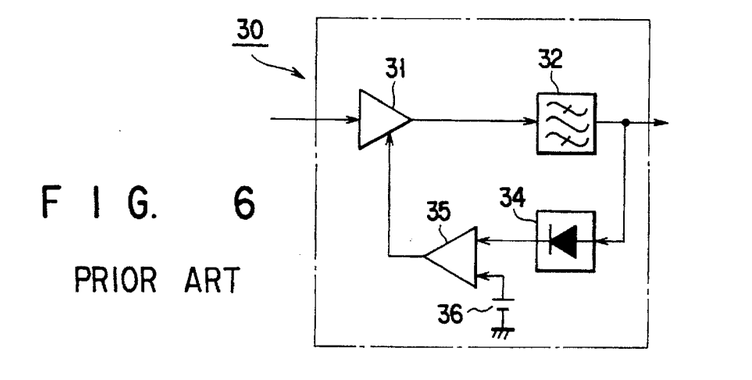
FIG. 6 is a circuit block diagram showing the structure of a conventional automatic gain control circuit.

FIG. 6 exemplifies the basic structure of a conventional AGC circuit 30. In this diagram, the unnecessary frequency component of a received intermediate-frequency signal, amplified by a variable-gain type intermediate frequency amplifier 31, is eliminated by an intermediate-frequency-pass filter 32. The resulting signal is input to a detector 34 as well as to a digital demodulator (not shown). This detector 34 detects the signal level of that received intermediate-frequency signal and sends the detected value to an error amplifier 35. This error amplifier 35 detects the differential voltage between the detected value and a reference voltage generated by a reference voltage generator 36. This differential voltage is then negative feedbacked as a gain control signal via a gain control terminal of the intermediate frequency amplifier 31 to change the gain of this amplifier 31. The gain of the intermediate frequency amplifier 31 is controlled so as to make the differential voltage to zero. As a result, the amplitude of the received intermediate-frequency signal is controlled to be always kept at the value corresponding to the reference voltage.

In actual application, however, the radio communication apparatus having the above conventional AGC circuit 30 has the following shortcoming. A mobile radio unit may simultaneously receive both the radio wave on a radio channel that is currently used in communication and the radio wave on an adjacent channel which has a greater reception electric field intensity than the former radio wave, thus causing crosstalk or radio interference. The former radio wave will be hereinafter referred to as "desired wave" (i.e., the desirable frequency for communication), and the latter as "interference wave." In such crosstalk, since the passband of the intermediate-frequency-pass filter 32 is generally set so wide as to permit the received intermediate-frequency signal on the adjacent channel to pass, the received intermediate-frequency signal of the interference wave will not be filtered sufficiently and will thus be output at a higher level than the level of the received intermediate-frequency signal of the intermediate frequency amplifier from the intermediate-frequency-pass filter 32. Accordingly, the detector 34 detects the received signal level of the interference wave on the adjacent channel, not the received signal level of the desired wave. As a result, the error amplifier 35 in the next stage outputs a gain control signal corresponding to the received signal level of the interference wave. This causes the intermediate frequency amplifier 31 to perform an erroneous gain control. The erroneous function in a channel selectivity operation, which has originated from the AGC circuit 30 with the above-described conventional structure, deteriorates the characteristic of the selectivity among adjacent channels, and will thus raise a very undesirable problem in the application of the radio communication apparatus.

As an improvement to overcome this problem, the passband of the intermediate-frequency-pass filter may be set to such a "narrow-band" that does not cause crosstalk. This setting however raises another problem. That is, the "group delay ripple component" in the characteristic of a modulated wave becomes larger, so that, particularly, the "bit error rate (BER)" in a digital demodulated signal is deteriorated. The "group delay ripple" is the width of fluctuation of group delay in the passband. This width of fluctuation depends on the length of the group delay, and the smaller the amplitude is, the more accurate the demodulation of the modulated wave can be. In dual mode, particularly, in digital mode, as the band of the filter in use is set narrower, the group delay ripple varies greatly. This increases the group delay ripple so that the accurate demodulation is no longer possible.

SUMMARY OF THE INVENTION

It is therefore an object of the present invention to provide a radio communication apparatus equipped with an automatic gain control circuit which can provide good adjacent channel selectivity and can prevent deterioration of the bit error rate of digital demodulatd signals.

To achieve the foregoing object, an automatic gain control (AGC) circuit that constitutes a reception system of a radio communication apparatus according to the present invention comprises:

level changing section of a variable gain type, inserted in a reception intermediate-frequency stage of the reception system, for outputting a received intermediate-frequency signal after changing the level thereof;

first intermediate-frequency-pass filter section having a predetermined first passband width, for eliminating an unnecessary frequency component from the received intermediate-frequency signal, output from the level changing section, for digital demodulation; and second intermediate-frequency-pass filter section having a second passband width set narrower than the first passband width, for eliminating an unnecessary frequency component from the received intermediate-frequency signal, output from the level changing section.

The intermediate-frequency signal, which has passed through the first band-pass filter is supplied for digital demodulation.

The received intermediate-frequency signal, which has passed through the second band-pass filter, is input to the detector where its signal level is detected. The difference between this detected signal level and the reference voltage generated from the reference voltage generator is detected by the error amplifier. This differential voltage is negative feedbacked as a gain control signal to the intermediate frequency amplifier to control the gain thereof.

With the above structure, the signal level detecting section in the AGC circuit of the radio communication apparatus of the present invention receives a received intermediate-frequency signal which has the received signal component of an interference wave on an adjacent channel filtered sufficiently by the second intermediate-frequency-pass filter section having a narrow-band. Therefore, the signal level detecting section can accurately detect the received signal level of the desired wave. As a result, the gain of the level changing section can be controlled properly in accordance with the received signal level of the desired wave so that sufficient selectivity among adjacent channels can be provided.

The received intermediate-frequency signal which has passed the first intermediate-frequency-pass filter having a wide band is supplied to the digital demodulating section. Therefore, the ripple component of the group delay in the passband of the first intermediate-frequency-pass filter is kept small to prevent deterioration of the bit error rate of digital demodulated data.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENT

Embodiment

In this embodiment, an automatic gain control (AGC) circuit whose structure is the feature of the present invention is adapted for use in a dual-mode type mobile radio telephone.

Figure 1:
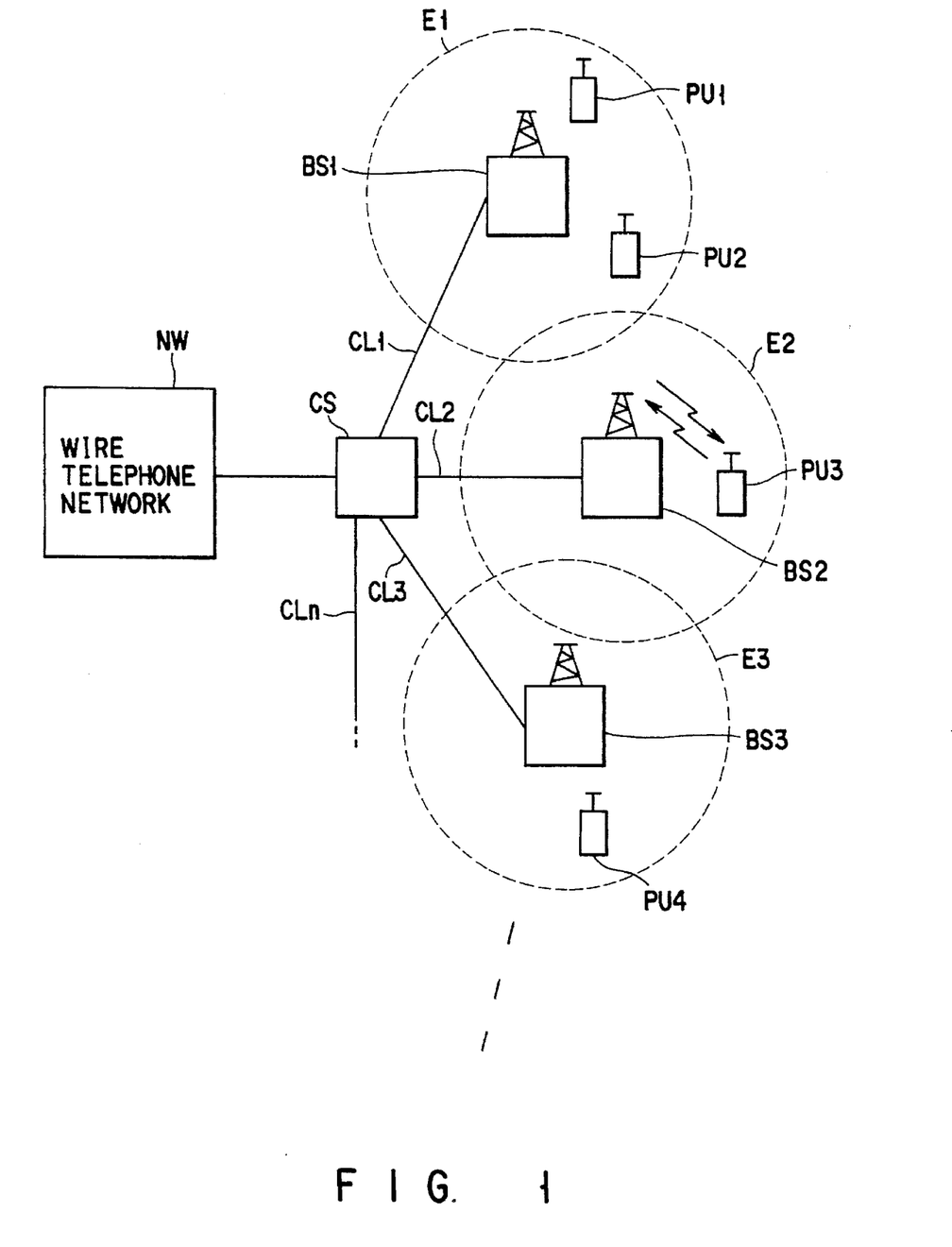
FIG. 1 is a diagram showing a general cellular radio system.

FIG. 1 illustrates an example of a cellular radio system which comprises mobile radio units (PU1–PU4) each having a reception system (not shown) that is equipped with the AGC circuit of the present invention. This cellular radio system will be described below more specifically.

First, the dual-mode type mobile radio communication system will be described with reference to FIG. 1. The dual mode mobile radio communication system operates in either an analog mode or a digital mode. The cellular radio system, as shown in FIG. 1, comprises a control station CS connected to a wire telephone network NW, a plurality of base stations BS1–BS3 which are respectively connected to the control station CS via the landlines CL1–CL3, and a plurality of mobile radio units PU1–PU4. Each of these base stations BS1–BS3 has its own radio zone E1–E3, respectively. The mobile radio units PU1–PU4 may be in communication with the base stations BS1–BS3 via radio links in the radio zones E1–E3.

The system may operate in the following manner. A control channel is first established for exchanging control signals between the base station and the mobile radio unit. A speech channel operating in either an analog mode or digital mode is then established between the base station and the mobile radio unit depending on a mode designation signal included in the control signals. In analog mode, a modulator angle-modulates carrier signals with speech signals and data. A transmitter then transmits the angle-modulated carrier signals. A receiver receives the angle-modulated carrier signals and a demodulator angle-demodulates the carrier signals to reproduce the speech signals and the data. In addition, an analog audio circuit may be provided which performs signal processing such as compression and expansion of transmission and received signals, and frequency band limiting of speech signals.

In digital mode, an encoder encodes speech signals and data. A modulator modulates carrier signals with the encoded digital speech signals and data. A transmitter then transmits the modulated carrier signals. For receiving information, the receiver receives the modulated carrier signals, the demodulator demodulates the carrier signals into baseband signals, and then a decoder decodes the baseband signals to reproduce the speech signals. Moreover, in digital mode, the digital speech signals are transmitted between the base stations and the mobile radio stations by means of TDMA (Time Division Multiple Access) transmission method. A digital modem, a speech-encoder/decoder (hereinafter referred to as "speech-codec") for encoding and decoding speech signals, a channel-encoder/decoder (hereinafter referred to as "channel-codec") for performing error correction and interleaving/deinterleaving for TDMA transmission may be provided.

In addition, the telephone system may include an echo-canceller both in analog and digital modes. The echo-canceller is used for cancelling acoustic echoes caused between a loudspeaker and a microphone during hands-free operation.

Figure 2:
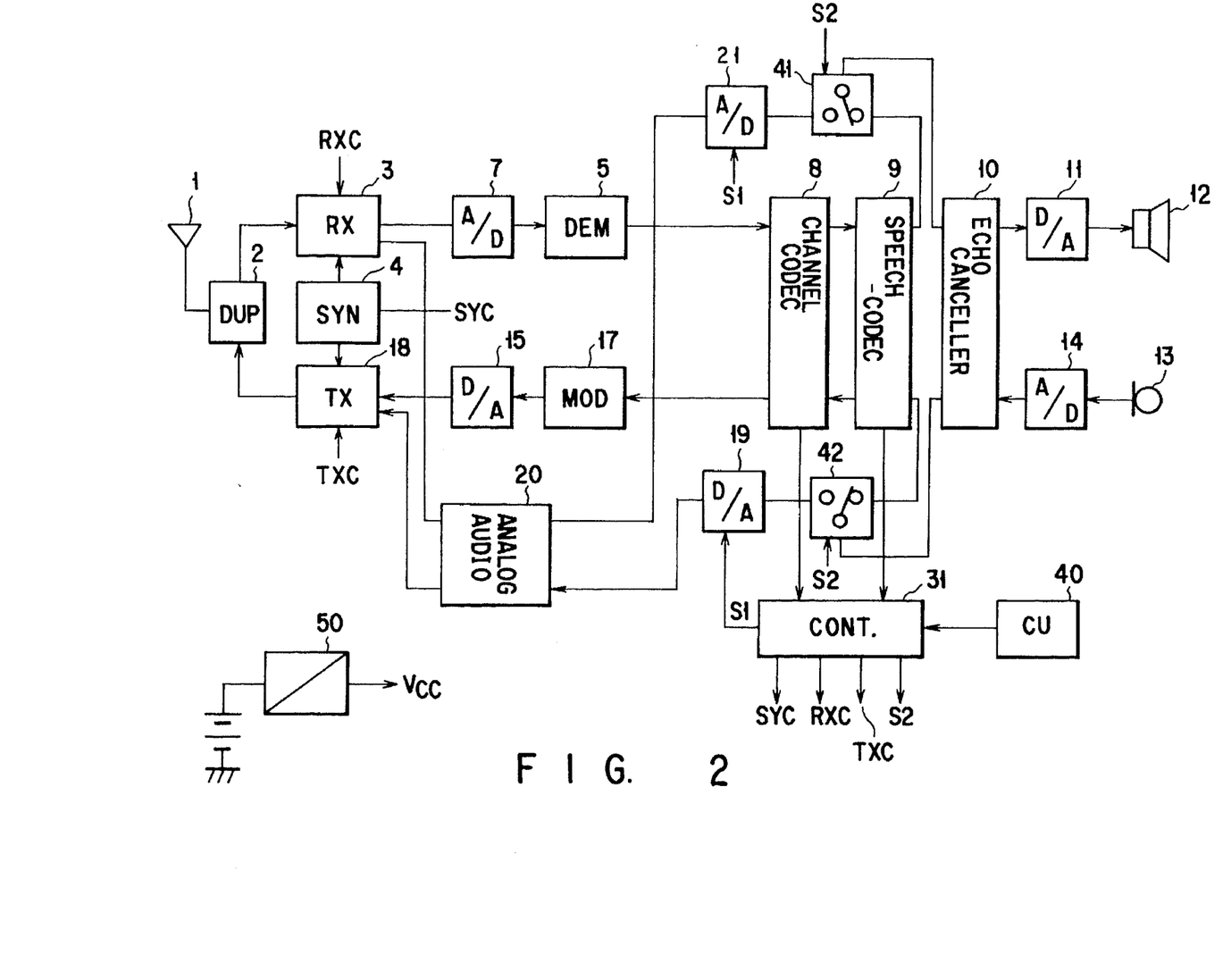
FIG. 2 presents a function block diagram of a dual-mode type mobile radio telephone.

FIG. 2 shows a dual-mode type mobile radio telephone apparatus which has the AGC circuit 30 of this embodiment incorporated in a reception system RX3.

The mobile radio telephone, as shown in FIG. 2, comprises an antenna 1 and a duplexer 2 in communication with the antenna 1. A receiver 3 and a transmitter 18 are coupled to the duplexer 2. A digital modulator 17 for use in digital mode is coupled to the transmitter 18. A synthesizer 4 provides signals of prescribed frequencies to the receiver 3 and the transmitter 18. An analog audio circuit 20 for use in analog mode is additionally coupled to the receiver 3 and the transmitter 18.

A channel-codec 8 and a speech-codec 9 coupled to the channel-codec are also provided. An echo-canceller 10 communicates with the speech-codec 9. An analog-to-digital converter (hereinafter referred to as "A/D converter") 7 is connected to the channel-codec 8 and a digital-to-analog converter (hereinafter referred to as "D/A converter") 15 is connected to the channel codec 8. A D/A converter 11 is coupled between a loudspeaker 12 and the echo-canceller 10. An A/D converter 14 is coupled between a microphone 13 and the echo-canceller 10. A controller 31 is coupled to the channel-codec 8, and the speech-codec 9. A control unit 40 having a hook switch, a keypad and a display communicates with the controller 31. A power source circuit 50 supplies a voltage Vcc to the circuitry from, for example, a battery.

The D/A converter 19 and the A/D converter 21 are controlled in response to logic levels of a switching control signal S1 output from the controller 31. The D/A converter 19 and the A/D converter 21 are selectively connected to the speech-codec 9 and the echo canceller 10 by the analog switches 41 and 42, respectively, in digital mode. In analog mode, the D/A converter 19 and the A/D converter 21 are controlled to connect the analog audio circuit 20.

The controller 31 mainly consists of a microcomputer. In addition to controlling radio link establishment operations, the controller 31 controls the operations of the channel-codec 8 and the speech-codec 9. The channel-codec 8 and the speech-codec 9 are rendered operative in digital mode and inoperative in analog mode. In the analog mode, speech signals pass through the channel-codec 8 and the speech-codec 9 without being encoded and decoded.

The operations of the mobile radio telephone will be described below. The mode of operation for the apparatus, which is either the analog mode or the digital mode, is determined on the basis of a mode designation signal included in the control signals which are transmitted from a base station and which also designate the speech channel. When the mobile radio unit receives the digital mode designation signal over the control channel, a speech radio link is established for transmission of the digital speech signals. Responsive to the establishment of the radio link, the controller 31 generates the signal S1 indicative of the digital mode. The analog switches 41 and 42 switch to the speech-codec 9 and the echo canceller 10, respectively, in response to the signal S2 designating the digital mode. The controller 31 provides control signals to initiate the operation of the channel-codec 8 and the speech-codec 9.

When the receiver 3 receives speech signals transmitted from the base station via the antenna 1 and the duplexer 2, the digital demodulator 5 demodulates the received signals into analog baseband signals. The A/D converter 7 converts the baseband signals supplied thereto into digital signals. The channel-codec 8 deinterleaves the digital baseband signals and performs error correction operations on the deinterleaved signals. The output signals from the channel-codec 8 are applied to the speech-codec 9 and decoded into digital speech signals. The output signals from the speech-codec 9 pass through the echo-canceller 10 and are supplied to the D/A converter 11. The D/A converter 11 converts the decoded digital speech signals to analog speech signals. The analog speech signals are output via the loudspeaker 12.

When speech signals are input to the microphone 13, the A/D converter 14 converts the speech signals into digital signals. The echo-canceller 10 cancels each signals caused by acoustic signals input to the microphone 13 from the loudspeaker 12. The echo-free signals are encoded in the speech-codec 9 and the encoded speech signals are supplied to the channel-codec 8.

In the channel-codec 8, an error correcting code is added to the encoded speech signals and the resulting speech signals are interleaved. The D/A converter 15 converts the interleaved signals into analog signals. The analog signals are input to the digital modulator 17 and the modulated therein. The transmitter 18 converts the modulated signals into radio frequency signals of 800–900 MHz and power-amplifies the radio frequency signals. The power amplified radio frequency signals are transmitted through the duplexer 2 and the antenna 1.

When the mobile radio unit receives the analog mode designation signal over the control channel, a speech radio link for transmission of the analog speech signals is established. Responsive to the establishment of the radio link, the controller 31 generates the signal S1 indicative of the analog mode.

The D/A converter 19 and the A/D converter 21 switch to the analog audio circuit 20 responsive to the signal S1 designating the analog mode. Because in analog mode it is not necessary to encode and decode signals, the controller 31 provides a control signal to the channel-codec 8 and the speech-codec 9 so that the channel-codec 8 and the speech-codec 9 are rendered inoperative.

When the receiver 3 receives speech signal transmitted from the base station via the antenna 1 and the duplexer 2, the receiver 3 demodulates the speech signals. The analog audio circuit 20 band-limits and expands the demodulated signals. The A/D converter 7 converts the expanded signals supplied thereto into digital signals. The digital signals are supplied to the channel-codec 8 and the speech-codec 9. Because the channel-codec 8 and the speech-codec 9 are rendered inoperative by the signal S1, the channel-codec 8 and the speech-codec 9 pass the digital signals without performing encoding and decoding operations. The signals are input to and pass through the echo-canceller 10. The D/A converter 11 converts the signals which have passed through the echo-canceller 10 into analog signals. The analog signals are output via the loudspeaker 12.

When speech signals are input to the microphone 13, the A/D converter 14 converts the speech signals into digital signals. The echo-canceller 10 cancels echo signals caused by acoustic signals input to the microphone 13 from the loudspeaker 12. The echo-free signals are supplied to the speech-codec 9 and the channel-codec 8. As described above, because the speech-codec 9 and the channel-codec 8 are rendered inoperative by the signal S1, the speech-codec 9 and the channel-codec 8 pass the echo-free signals without performing encoding and decoding operations. The D/A converter 15 converts the signals, which have passed through the speech-codec 9, into analog signals. The analog signals are input to the analog audio circuit 20. The analog audio circuit 20 band-limits and compresses the analog signals. The transmitter 18 modulates the compressed signals and transmits the signals to the base station via the duplexer 2 and the antenna 1.

According to the embodiment described above, the telephone unit, the A/D converter 7 and the D/A converter 15 may be used in both analog and digital modes. Moreover, the echo-canceller 10 may be used in both analog and digital modes. Therefore, the telephone unit requires fewer A/D converters, fewer D/A converters, and only one echo-canceller. Thus, it is possible to simplify the circuitry and to reduce the size of the overall telephone unit.

Additionally, according to the embodiment described above, speech signals are input to the channel-codec 8 and the speech-codec 9 in analog mode. However, the channel-codec 8 and the speech-codec 9 are rendered inoperative in analog mode by the control signal S1. Therefore, the channel-codec 8 and the speech-codec 9 pass the speech signals without performing encoding and decoding operations. Accordingly, the present arrangement advantageously avoids unnecessary signal processing.

Figure 3:
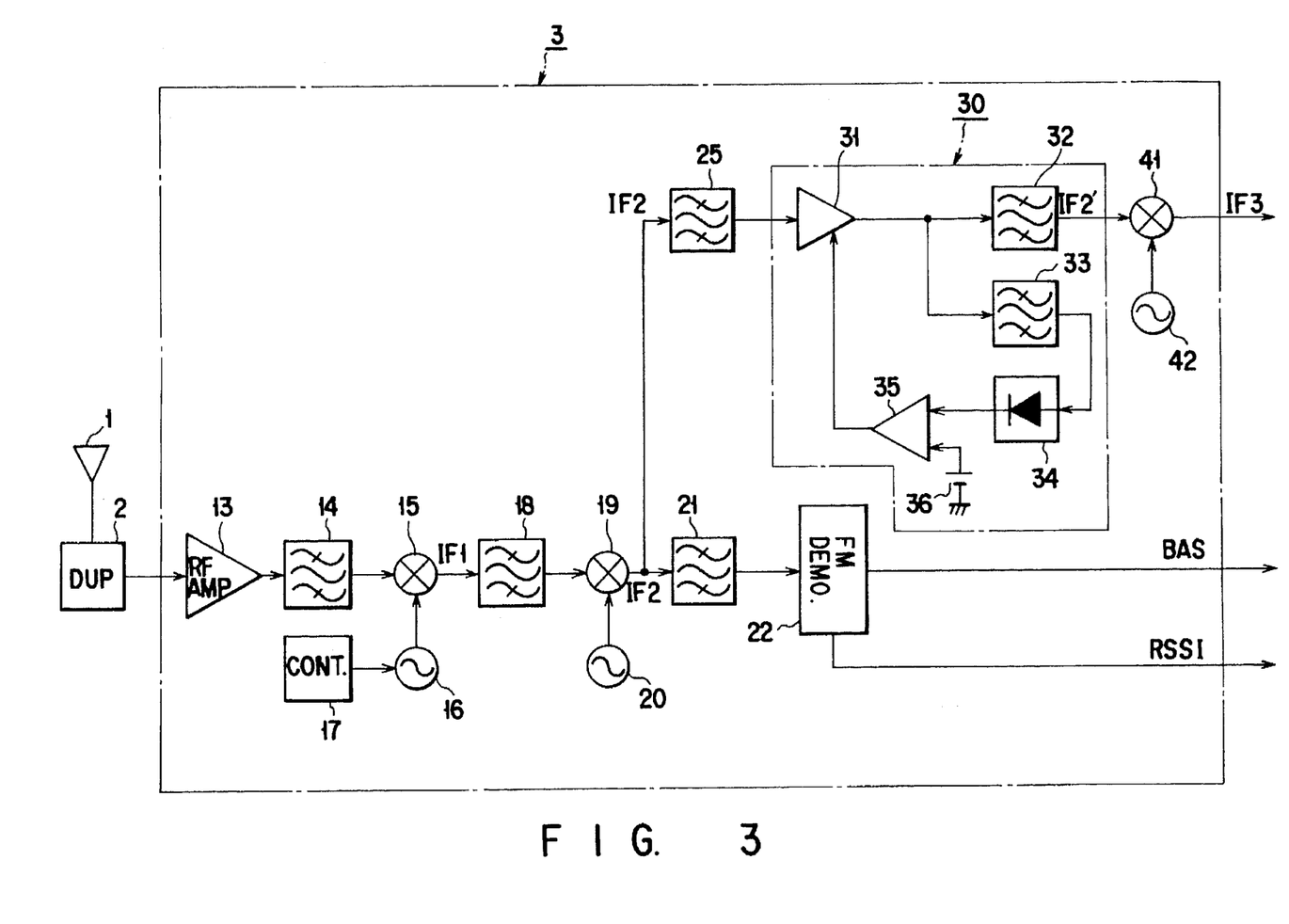
FIG. 3 is a circuit block diagram showing the structure of a radio communication apparatus equipped with an automatic gain control (AGC) circuit according to one embodiment of the present invention.

FIG. 3 is a circuit block diagram of the AGC circuit 30 which constitutes the aforementioned reception system RX3. Referring to this diagram, radio carrier signals transmitted from a base station (not shown) are received at the antenna 1 and are input to a high frequency amplifier (RF AMP) 13 of a variable gain type via the duplexer 2. After being subjected to high frequency amplification in this amplifier 13, this signal is sent to a high-frequency filter 14 where its unnecessary frequency component is eliminated. The received high-frequency signal, passed through the high-frequency filter 14, is input to a first mixer 15 to be mixed with a first received local oscillation signal, which is generated by a frequency synthesizer 16, so that it is frequency-converted into a first received intermediate-frequency signal IF1. The frequency of the received local oscillation signal from the synthesizer 16 is designated by a controller 17 in accordance with the radio speech channel in use. The first received intermediate-frequency signal IF1 passes through a first intermediate-frequency-pass filter 18 and is input to a second mixer 19 where this signal is mixed with a second received local oscillation signal, generated from a fixed oscillator 20, to be frequency-converted into a second received intermediate-frequency signal IF2.

This second received intermediate-frequency signal IF2 is distributed in two ways to be sequentially supplied to a signal processor (not shown) for the analog mode and a signal processor (i.e., 25, 30, 41, 42) for the digital mode. One of the distributed signals is input to an FM demodulator 22 after passing through a second intermediate-frequency-pass filter 21 whose passband is set relatively narrow for analog demodulation. This FM demodulator 22 performs FM demodulation of the second received intermediate-frequency signal. The resultant analog baseband signal BAS is amplified by a low frequency amplifier (not shown), and is then output from a loudspeaker (not shown) located in the subsequent stage (see FIG. 2).

The FM demodulator 22 also detects the intensity of the reception electric field based on the level of the second received intermediate-frequency signal IF2. An RSSI (Received Signal Strength Indicator) detection signal representing this field intensity is supplied to a controller (not shown) which is used to search for a radio channel.

The other distributed signal passes through another second intermediate-frequency-pass filter 25 whose passband is set wider than that of the intermediate-frequency-pass filter 21 for digital demodulation, and is then input to the AGC circuit 30 in the subsequent stage.

This AGC circuit 30 comprises a variable gain type intermediate frequency amplifier (IF AMP) 31, first and second band-pass filters 32 and 33, located in the subsequent stage of the amplifier 31, a detector 34, an error amplifier 35 and a reference voltage generator 36. The last three circuits 34, 35 and 36 together with the second band-pass filter 33 constitute an "AGC loop."

Figure 4A:
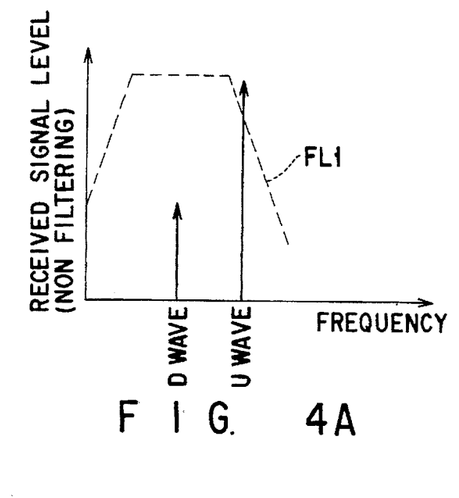
FIGS. 4A and 4B present frequency response charts exemplifying the width of the passband of a first band-pass filter included in the automatic gain control circuit shown in FIG. 3, and the level of a received intermediate-frequency signal which has passed this filter.

The passband width of the first band-pass filter 32 is set relatively wide for digital demodulation. FIG. 4A shows an example of the relationship between the passband width FL1 of the first band-pass filter 32, the desired wave (D wave) and the interference wave (U wave) on an adjacent channel. The passband width of the second band-pass filter 33 is set narrower than that of the first band-pass filter 32.

More specifically, the first band (intermediate frequency) -pass filter 32 is a wide-band analog filter with a passband width of 3 dB and is a frequency f0±21 kHz (f0: center frequency) or higher. Meanwhile, the second band (intermediate frequency)-pass filter 33 is a narrow-band analog filter with a passband width of 6 dB and is a frequency f0±7.5 kHz or higher. And a passband width of 50 dB is a frequency f0±15 kHz or below.

Figure 5A:
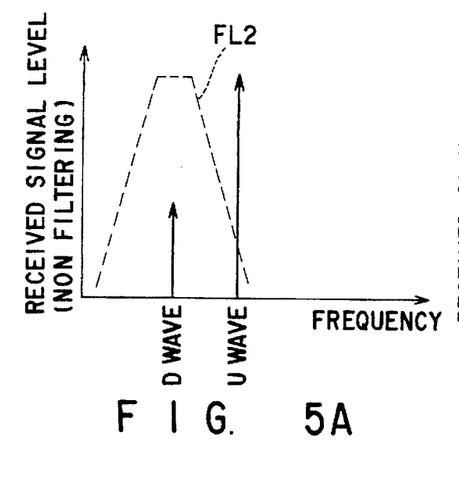
FIGS. 5A and 5B present frequency response charts exemplifying the width of the passband of a second band-pass filter included in the automatic gain control circuit shown in FIG. 3, and the level of a received intermediate-frequency signal which has passed this filter.

FIG. 5A shows an example of the relationship between the passband width FL2 of the second band-pass filter 33, the desired wave (D wave in the diagram) and the interference wave (U wave in the diagram) on an adjacent channel.

The received intermediate-frequency signal IF2', which has passed the first band-pass filter 32, is input to a third mixer 41 where it is mixed with a third received local oscillation signal, generated from a fixed oscillator 42, to be frequency-converted into a third received intermediate-frequency signal. Then, this third received intermediate-frequency signal is input to a digital demodulator (not shown) to be demodulated into a digital received signal of a baseband through "quadrature demodulation" and "differential detection system," for example. Finally, the digital received signals of the baseband is amplified by a low frequency amplifier (not shown) and is output from the loudspeaker (not shown). (See FIG. 2.)

The received intermediate-frequency signal, which has passed through the second band-pass filter 33, is input to the detector 34 where its signal level is detected. The "difference" between this detected signal level and the reference voltage generated from the reference voltage generator 36 is detected by the error amplifier 35. This "differential voltage" is negative feedbacked as a gain control signal to the intermediate frequency amplifier 31 to control the gain thereof.

The above-described structure of the AGC circuit 30 of this embodiment provides the following effect and action. When communication in digital mode is initiated between the mobile radio unit and the base station (BS1–BS3 in FIG. 1) over an arbitrary radio channel and the second received intermediate-frequency signal is input to the AGC circuit, this second received intermediate-frequency signal is amplified by the intermediate frequency amplifier 31, and is then supplied via the first band-pass filter 32 to the third mixer 41 for digital demodulation. The second received intermediate-frequency signal, output from the intermediate frequency amplifier 31, is sent through the second band-pass filter 33 to the detector 34 where its signal level is detected. A voltage corresponding to the difference between this detected signal level and the reference voltage from the reference voltage generator 36 is output as a "gain control signal" from the error amplifier 35. The gain of the intermediate frequency amplifier 31 is optimally controlled by this gain control signal. This gain control always keeps the level of the received intermediate-frequency signal output from the intermediate frequency amplifier 31 at a constant level even if the level of the received signal varies during communication. Therefore, the digital demodulator, which is located in the subsequent stage to receive the modulated signal with such a constant signal level, can always perform stable digital demodulation.

Figure 5B:
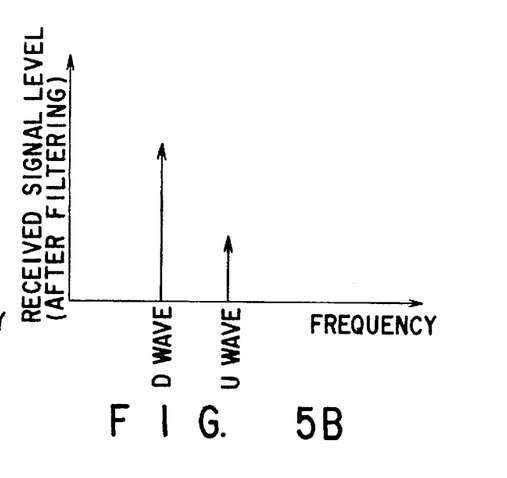

In this stable state, the positional relation to a certain base station may vary due to a change in the position of the mobile radio unit or the interference wave on an adjacent channel which has a higher reception electric field intensity than the desired wave due to the "fading." In this case, the received intermediate-frequency signal of the desired wave and the received intermediate-frequency signal of the interference wave on the adjacent channel, which has a higher level than the former signal, are input to the AGC circuit 30 of this embodiment. However, the second band-pass filter 33 whose passband width is set to the "narrow-band" as shown in FIG. 5A is inserted into the AGC circuit 30 of this embodiment, which forms the "AGC loop." The received intermediate-frequency signal of the interference wave is filtered to a sufficiently low level by the second band-pass filter 33, so that the interference wave has a signal level sufficiently lower than that of the received intermediate-frequency signal of the desired wave, as shown in FIG. 5B, when it is input to the detector 34. Consequently, the detector 34 can accurately detect the received signal level of the desired wave without receiving substantial influence of the interference wave. The gain of the intermediate frequency amplifier 31 therefore can always be controlled in accordance with the received signal level of the desired wave. The "adjacent channel separation" of the AGC circuit 30 as the reception system will not be affected by the communicating position and the interference wave of the adjacent channel, thus always ensuring an excellent reception characteristic.

Figure 4B:
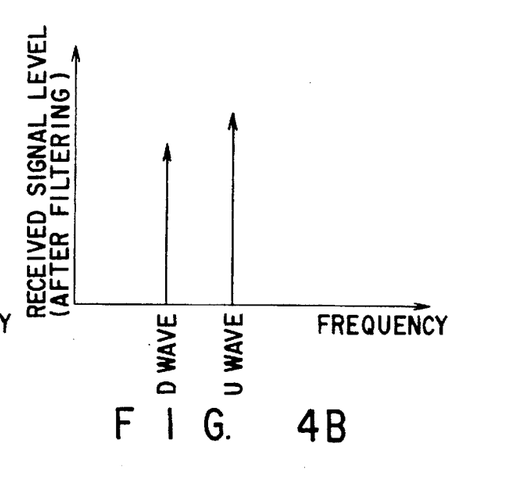

If the passband width of the intermediate-frequency-pass filter provided in the circuit that forms the AGC loop is set to the passband width FL1 as shown in FIG. 4A, the received intermediate-frequency signal of the interference wave (U wave) would be supplied almost directly to the detector 34 in the subsequent stage while having its signal level hardly attenuated, as shown in FIG. 4B. This would cause the AGC loop to perform an erroneous gain control in accordance with the received signal level of the interference wave. In view of this point, this embodiment has the following structure.

The first band-pass filter 32 whose passband width is set wide as shown in FIG. 4A, is inserted in the signal supplying passage to the digital demodulator in the AGC circuit 30 of this embodiment. Therefore, the ripple component of the group delay time in the passband of the first band-pass filter 32 becomes smaller. Consequently, the received intermediate-frequency signal of the desired wave is subjected to digital demodulation without being influenced by the ripple of the band-pass filter 32 so much. It is thus possible to suppress the bit error rate of digital demodulated data, thus ensuring high-quality voice communication.

In short, according to this embodiment, the first band-pass filter 32 having a wide passband width is inserted in the signal supplying passage to the digital demodulator and the second band-pass filter 33 having a "narrow-band" is inserted into the AGC loop. Even if the interference wave on an adjacent channel having a higher signal level than the received signal level of the desired wave is received, therefore, the received signal of the interference wave has its level sufficiently reduced when input to the detector 34 of the AGC loop. Accordingly, the AGC loop will not be strongly affected by the interference wave and can properly control the gain of the intermediate frequency amplifier 31 in accordance with the received signal level of the desired wave. This can always keep excellent adjacent channel selection.

Since the received intermediate-frequency signal is subjected to digital demodulation after passing the first band-pass filter 32 with a wide band, this signal will not be deformed greatly by the ripple of the group delay time. The digital demodulator can therefore perform the accurate demodulation and the bit error rate of the demodulated digital signal can be suppressed to a low level. Mobile radio communication with high quality thus becomes possible by the use of a mobile radio telephone whose reception system has the AGC circuit of this embodiment.

The present invention is not limited to the above embodiment.

(1) For instance, while the first band-pass filter 32 and second band-pass filter 33 having fixed passbands are used as the first and second intermediate-frequency-pass filters in the above-described embodiment, a plurality of active filters whose passbands are selectable may be used instead so that their passbands can be selectively determined in accordance with, for example, the channel interval.

(2) The AGC circuit may be constituted by a digital processor. In this case, digital filters need to be used as the first and second intermediate-frequency-pass filters.

(3) In the above described embodiment, the gain control signal is supplied to the intermediate frequency amplifier 31, and the gain is controlled.

The gain control may be performed by a variable attenuator placed at the front or rear of the intermediate frequency amplifier 31 to which the gain control signal is supplied.

Although the AGC circuit of the present invention is incorporated in a "dual-mode type" mobile radio telephone in the foregoing description of this embodiment, it may be applied to a mobile radio telephone, a portable mobile radio telephone, a cordless telephone, etc. which operates only in a digital communication system.

The passband widths of the first and second intermediate-frequency-pass filters, the circuit structure of the AGC circuit, the type of the communication system and the circuit structure of the radio circuitry may be changed or modified in various manners without departing from the scope and spirit of this invention.

Accordingly, this invention can provide a radio communication apparatus having an automatic gain control (AGC) circuit, which can always ensure excellent adjacent channel separation and can prevent the bit error rate of the digital demodulated signal from lowering even in mobile radio communication whose communication conditions vary with time.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A radio communication apparatus for use in a radio communication system wherein signals are transmitted between a base station and the radio communication apparatus over a radio link, comprising:

receiving means for receiving signals transmitted from the base station over the radio link and for outputting received signals having a desired frequency;

level changing means for changing a level of the received signals output from said receiving means and outputting the level-changed signals;

first band-pass filtering means connected to an output terminal of said level changing means, having a first pass band including the desired frequency, for filtering the level-changed signals output from said level changing means and outputting the first filtered signals;

mixer means for mixing the first filtered signals output from said first filtering means with a local oscillation signal to output an intermediate-frequency signal;

demodulating means for demodulating the intermediate-frequency signal output from said mixer means;

second band-pass filtering means connected parallel to the first band-pass filtering means and connected to an output terminal of said level changing means prior to said mixing means, having a second pass band narrower than the first pass band, for filtering the level-changed signals output from said level changing means and outputting the second filtered signals, the second pass band including the desired frequency; and level controlling means for controlling said level changing means according to a level of the second filtered signals output from said second filtering means.

2. The radio communication apparatus according to claim 1, wherein said level controlling means comprises comparing means for comparing the level of the second filtered signals outputted from said second filtering means with a reference level and for outputting to said level changing means, signals representative of a result of the comparison.

3. The radio communication apparatus according to claim 1, wherein said receiving means receives signals of a radio frequency transmitted from the base station over the radio link, converts received signals of a radio frequency to signals of an intermediate frequency, and outputs converted signals of an intermediate frequency as received signals.

4. The radio communication apparatus according to claim 1, wherein said level changing means, said first filtering means, said second filtering means, and said level controlling means comprises a digital processing circuit.

5. The radio communication apparatus according to claim 1, wherein said first filtering means comprises a first digital filter and said second filtering means comprises a second digital filter.

6. The radio communication apparatus according to claim 1, wherein said first pass band and said second pass band have substantially the same center frequency.

7. A radio communication apparatus for use in a system wherein signals are transmitted between the apparatus and another apparatus, comprising:

receiving means for receiving signals transmitted from the other apparatus and having a desired frequency;

level changing means for changing a level of the signals received by said receiving means and for outputting level-changed signals;

first band-pass filtering means connected to an output terminal of said level changing means, having a first pass band including the desired frequency, for filtering the level changed signals output from said level changing means and outputting the first filtered signals;

mixer means for mixing the first filtered signals output from said first filtering means with a local oscillation signal to output an intermediate-frequency signal;

an analog to digital converting means for converting the intermediate-frequency signal into a digital signal;

means for performing a digital demodulation processing to the digital signal to produce a digital baseband signal;

second band-pass filtering means connected parallel to the first band-pass filtering means and connected to an output terminal of said level changing means prior to said mixing means, having a second pass band narrower than the first pass band, for filtering the level changed signals output from said level changing means and outputting the second filtered signals, the second pass band including the desired frequency; and level controlling means for controlling said level changing means according to a level of the second filtered signals output from said second filtering means.

8. The apparatus according to claim 7, wherein said first pass band and said second pass band have substantially the same center frequency.

9. The radio communication apparatus according to claim 1 or 7, wherein said level changing means, said first band-pass filtering means, and said second band-pass filtering means results in an Automatic Gain Control loop which is unaffected by interference.

10. The radio communication apparatus according to claim 9, wherein said Automatic Gain Control loop properly controls said level changing means in accordance with the received signals.

* * * * *